(12) United States Patent
Pöchmüller

(10) Patent No.: US 6,542,430 B2
(45) Date of Patent: Apr. 1, 2003

(54) INTEGRATED MEMORY AND MEMORY CONFIGURATION WITH A PLURALITY OF MEMORIES AND METHOD OF OPERATING SUCH A MEMORY CONFIGURATION

(75) Inventor: Peter Pöchmüller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/957,390

(22) Filed: Sep. 20, 2001

(65) Prior Publication Data

US 2002/0034118 A1 Mar. 21, 2002

(30) Foreign Application Priority Data

Sep. 20, 2000 (DE) .......................................... 100 46 578

(51) Int. Cl.[7] .................................................. G11C 8/00
(52) U.S. Cl. .............................. 365/230.03; 365/230.01
(58) Field of Search ........................ 365/230.03, 230.01

(56) References Cited

U.S. PATENT DOCUMENTS

| | | | |
|---|---|---|---|
| 5,283,792 A | * | 2/1994 | Davies, Jr. et al. ............ 371/66 |
| 5,321,652 A | | 6/1994 | Ito ......................... 365/189.07 |
| 5,410,669 A | * | 4/1995 | Biggs et al. ................. 395/425 |
| 6,335,895 B1 | * | 1/2002 | Sugibayashi ................. 365/227 |

FOREIGN PATENT DOCUMENTS

| DE | 41 43 562 C2 | 1/1998 |
|---|---|---|
| GB | 2 060 961 A | 5/1981 |

* cited by examiner

Primary Examiner—M. Tran
(74) Attorney, Agent, or Firm—Laurence A. Greenberg; Werner H. Stemer; Gregory L. Mayback

(57) ABSTRACT

A memory configuration has at least two memories connected to one another. In the event of a memory cell access, it is ascertained in a comparison circuit of the first memory whether the address applied to a first communications interface of the memory corresponds to an address of data stored in the first memory. In the event of non-correspondence of the addresses, the address of the requested data is transferred by a control circuit via a second communications interface, which can be operated independently of the first communications interface, to the second identical memory. The requested data are received from the second memory via the second communications interface of the first memory and output via the first communications interface of the first memory. Point-to-point connections enable a high data transfer rate of the memory configuration and hence a high data throughput with good signal quality.

28 Claims, 3 Drawing Sheets

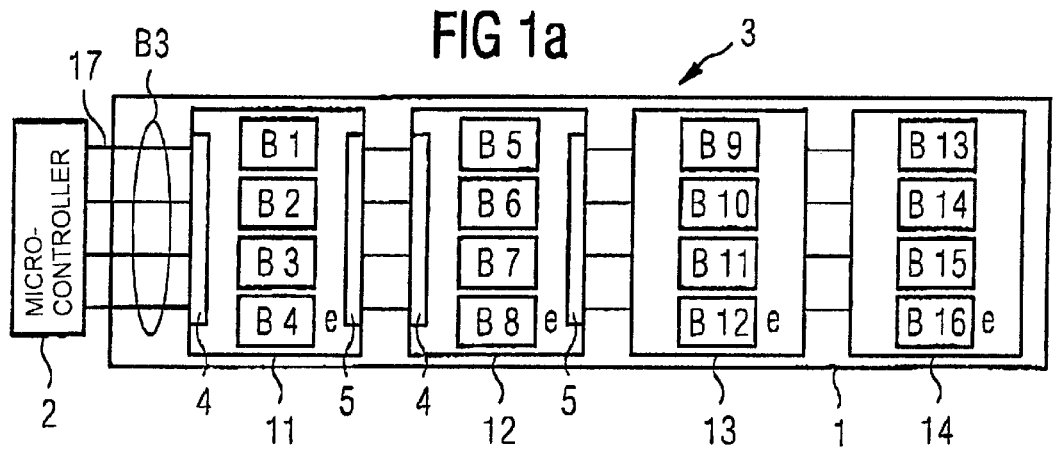
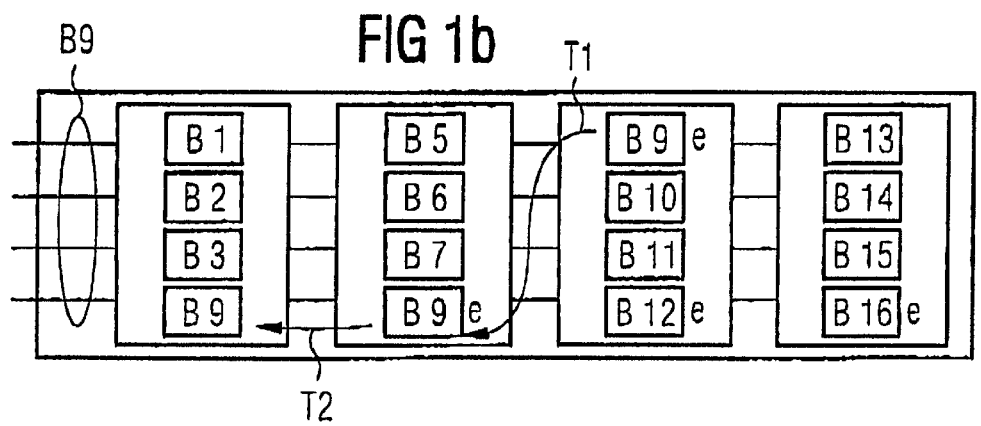
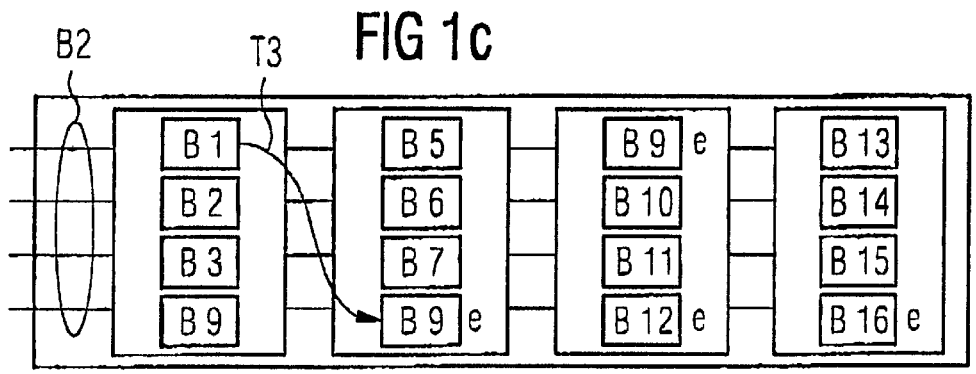
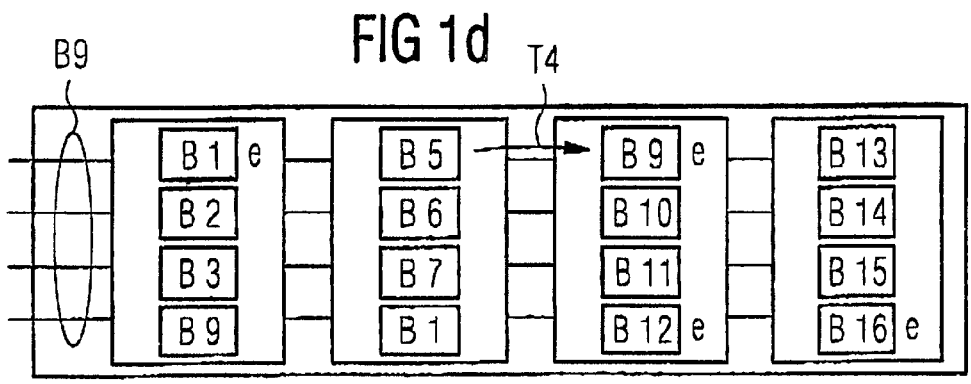

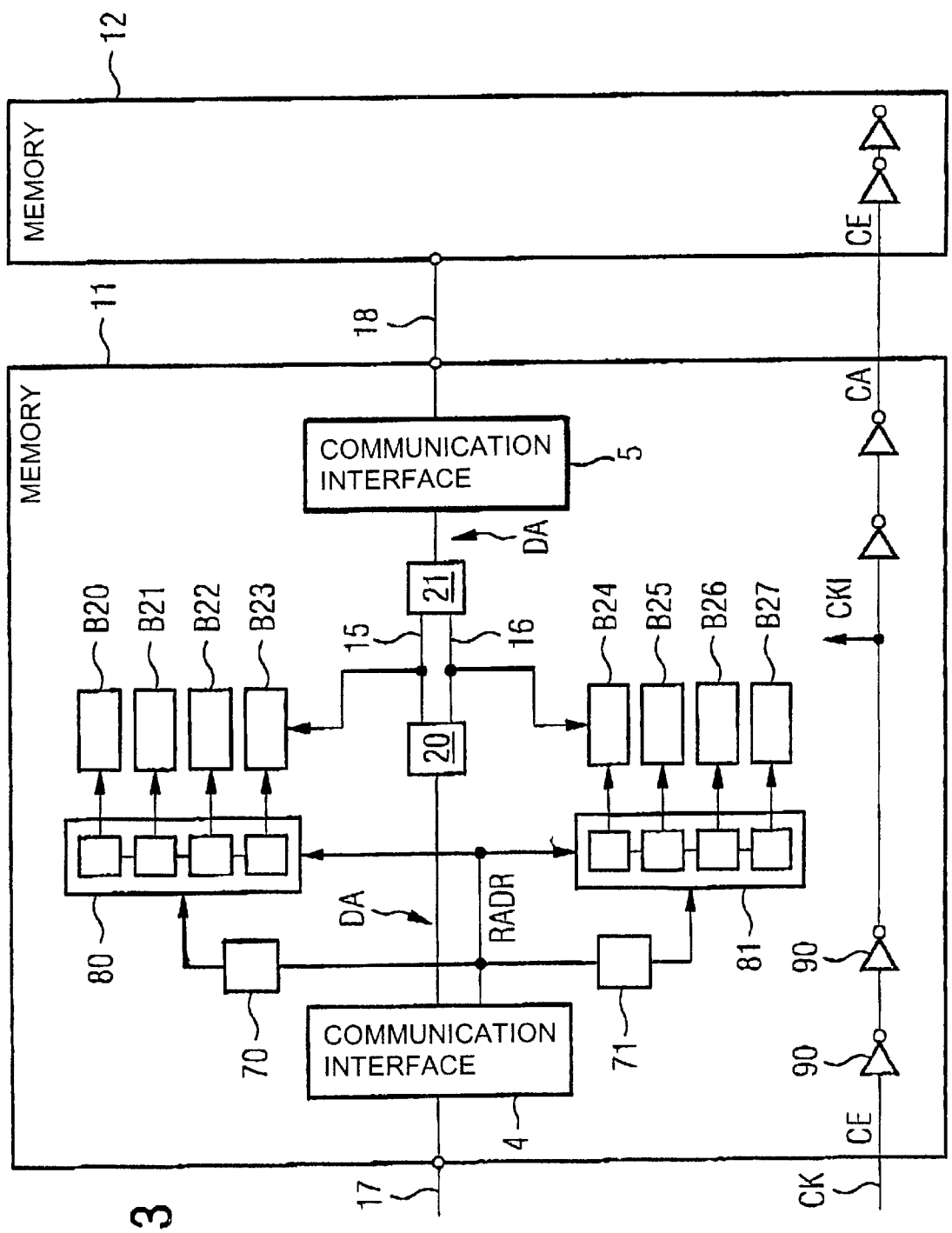

INTEGRATED MEMORY AND MEMORY CONFIGURATION WITH A PLURALITY OF MEMORIES AND METHOD OF OPERATING SUCH A MEMORY CONFIGURATION

BACKGROUND OF THE INVENTION

Field of the Invention

The invention lies in the integrated technology field. More specifically, the present invention relates to an integrated memory and a memory configuration having at least a first memory and a second memory and also to a method for operating a memory configuration having at least a first memory and a second memory.

Configurations such as, for example, personal computer systems (PC systems) generally have data processing devices in the form of microprocessors or micro-controllers and functional units such as program memories, data memories or input/output peripheral assemblies. The microprocessor thereby usually constitutes the central control and computation unit and is therefore also referred to as the so-called central processing unit (CPU). The data memory, which is generally embodied as a so-called random access memory (RAM), contains, for example, data which are accessed during a memory access. The electrical connection between the microprocessor and the data memory, for example, is usually established via a bus system.

It can generally be observed that, in order to increase the data throughput, microprocessors are operated with increasing processing speeds and hence increasing transmission frequencies as well. For this reason, in particular, it is endeavored likewise to increase the processing speed and transmission frequency on the corresponding bus systems, in order not to limit the overall performance of the PC system. However, this can generally lead to physical and/or electrical problems. Particularly in the case of comparatively long bus systems connected to a memory configuration having a plurality of memories or memory modules connected in parallel, increasing transmission frequencies can be accompanied by a high degree of reflection and interference of signals to be transmitted. This can impair the signal quality and hence the detect ability of the data to be transferred. This reflection and interference is caused for example by a multiplicity of memory modules connected in parallel and the—as a result—limited possibilities for suitable matching of the electrical parameters and/or by limited electrical properties of the bus systems and of the connected memory modules.

SUMMARY OF THE INVENTION

It is accordingly an object of the invention to provide an integrated memory and a memory configuration having at least a first memory and second memory, which overcomes the above-mentioned disadvantages of the heretofore-known devices and methods of this general type and which enables a comparatively high data throughput in each case with good detectability of the data to be transferred being maintained. It is a further object of the present invention to specify a method for operating a memory configuration having at least a first memory and a second memory, by means of which a comparatively high data throughput of the memory configuration, for example to a micro-controller, can be achieved with good detectability of the data to be transferred.

With the foregoing and other objects in view there is provided, in accordance with the invention, an integrated memory, comprising:

a memory cell array for storing data;

first and second communications interfaces for data transfer each connected to a respective data bus system, and each operable independently of one another;

wherein the memory cell array can be connected to the data bus system for a memory cell access;

a comparison circuit connectible to the first communications interface, the comparison circuit comparing an address of data stored in the memory cell array with an address applied to the first communications interface, and activating the memory cell array for a memory cell access in dependence on a comparison result; and a control circuit connectible to the comparison circuit and the second communications interface, for forwarding the applied address to the second communications interface in dependence on the comparison result of the comparison circuit.

There is also provided, in accordance with the invention, a memory configuration which comprises two or more memories as outlined above. The first communications interface of a first memory is connected to a communication bus and the second communications interface of the first memory is connected to the first communications interface of the second memory.

With the above and other objects in view there is also provided, in accordance with the invention, a method of operating a memory configuration having at least a first memory for storing data, first and second communications interfaces for data transfer to and from the first memory, and having a second memory for storing data, first and second communications interfaces for data transfer to and from the second memory, wherein the first communications interface of the second memory is connected to the second communications interface of the first memory, the method which comprises:

operating the first and second communications interfaces of the first and second memories independently of one another;

applying an address of requested data from outside the memory configuration to the first communications interface of the first memory;

ascertaining whether the applied address corresponds to an address of data stored in the first memory;

if the applied address corresponds to an address of data stored in the first memory, outputting stored data via the first communications interface of the first memory; and if the applied address does not correspond to an address of data stored in the first memory, transferring the address of the requested data to the second communications interface of the first memory, receiving the requested data from the first communications interface of the second memory via the second communications interface of the first memory, and outputting the requested data via the first communications interface of the first memory.

The memory according to the invention and the memory configuration according to the invention make it possible to achieve a comparatively high data throughput of data to be transferred. This is achieved in particular by virtue of the fact that the communication bus connected to the first memory and the connection between the first memory and the second memory are electrically decoupled. This makes it possible to operate the communication bus and the bus system between the first memory and the second memory with comparatively high data transmission frequencies.

Moreover, the electrical isolation of the bus systems makes it possible to embody the bus systems in such a way that a no relatively low degree of signal reflection occurs. As a result, the signal quality and hence the transmission frequency, too, can be significantly increased. The memory configuration according to the invention creates so-called point-to-point connections of the bus systems which can be configured in such a way that a relatively low degree of reflection occurs even at relatively high signal frequencies. This makes it possible to increase the signal quality and thus the signal frequency. In addition, the creation of isolated bus systems means that it is not absolutely necessary to raise the electrical requirements made of the bus system connecting the two memories and also the electrical requirements made of the second memory itself or of the interface unit thereof.

The invention makes it possible, in particular, to realize memory systems that, in principle, are as large as desired, without having to reduce the data transmission frequency. The memory configuration according to the invention can, in principle, be expanded by as many memories or memory modules as desired. This constitutes a major advantage primarily for future server realizations, for example for the Internet.

The invention can advantageously be used in a main memory system of a PC system. The latter usually comprises a relatively long memory bus system to which one or more memory modules are connected, the memory modules generally being embodied as so-called RAMs.

The memory according to the invention or the memory configuration according to the invention supports a so-called cache mechanism by virtue of the function of the comparison circuit in conjunction with the control circuit. This means, in particular, in the case where the memory configuration is connected to a micro-controller, for example, that the information currently required by the micro-controller is stored as far as possible in the first memory, whereas information that has not been required for a relatively long time is stored as far as possible in the second memory and is thus removed further from the micro-controller. In the case where information stored in the second memory is required by the micro-controller, it is automatically requested and received, under the control of the control circuit, via the second communications interface of the first memory and output via the first communications interface of the first memory to the micro-controller.

If we assume that a microprocessor or the application running in the microprocessor accesses almost the same information over a relatively long time period, the access time of individual memory accesses is reduced further overall if the information is stored in the first memory. The point-to-point connection between the microprocessor and the first memory can correspondingly be operated at high frequency. For the purpose of a moderate increase in costs, the connection between the first memory and second memory can correspondingly be operated at a lower frequency.

In order to support a cache mechanism of this type, it is therefore expedient for the data received via the second communications interface to be stored in the first memory. As a result, future memory accesses in proximity to the last memory access can be processed more rapidly since the information required last has been moved into the vicinity of the microprocessor. However, realizations are also conceivable wherein required data are transferred directly to the first memory without the data first being stored in the first memory.

In a further advantageous development of the method, the received data are stored in the first memory only after having been output via the first communications interface. As a result, a micro-controller connected to the first memory can continue to work immediately after a memory access. After the memory access, in parallel with other micro-controller accesses, the information required last can be transferred to the first memory and stored there.

In a particularly advantageous embodiment of the method according to the invention, a freely available memory area for storing data is defined in the first memory, which memory area is used for storing data received via the second communications interface. In this case, the memory configuration is preferably operated in such a way that at least one memory area of the first memory is "empty", that is to say no relevant or request able data which could be accessed are stored in the corresponding memory area prior to the storage of received data.

If data received from the second memory are written to a freely available memory area of the first memory, a freely available memory area is no longer present. For this reason, it is advantageous to subdivide the first memory into a plurality of memory areas, for instance in the form of memory banks, for storing data, to transfer data of one of the memory areas to the second memory and to define this memory area as freely available memory area. In this case, it is preferable to choose data of a memory area which have not undergone a memory access for a relatively long time already. The data of such a memory area are transferred for example when there is no longer a freely available memory area in the first memory.

Furthermore, the invention can advantageously be utilized for repairing defective memory areas of the first memory and/or of the second memory. To that end, the first memory and/or the second memory are/is subdivided into a plurality of memory areas for storing data, one of the memory areas of the first memory and/or of the second memory being inhibited for a data access, for example in the case of defective memory cells. As a result, the memory configuration can reliably continue to be used.

The inhibiting can be implemented directly during production, for example. For this purpose, the relevant memory has, for example, programmable elements for storing an address of a memory area to be deactivated. The programmable elements are advantageously embodied in the form of electrical or metallic fuses. The latter can be severed or programmed for example by means of an electric voltage or a laser beam. A memory area can also be inhibited during operation of the memory configuration. By way of example, if the failure of individual memory cells is detected during operation, the affected memory area can be inhibited for further operation when such defect events occur. This can be implemented for example by setting a corresponding register or by programming electrically programmable elements.

In an advantageous embodiment of the integrated memory according to the invention, the memory cell array of the memory is subdivided into two memory blocks which can be connected to the data bus system independently of one another. This enables an efficient realization of the cache concept. In order to further increase the efficiency, the memory has two data bus systems which are each connected to the first and second communications interfaces and can be operated separately from one another. This makes it possible, in particular, for both communications interfaces to be actively operated simultaneously. By way of example, if a memory access takes place via the first communications interface via one of the data bus systems, data received via the second communications interface can advantageously simultaneously be transferred via the other data bus system to a freely available memory area of the memory. For this purpose, the first communications interface and the second communications interface of the memory are operated in parallel for the data transfer.

In order to support such a method of operation, it is advantageous, moreover, that a freely available memory area is in each case defined simultaneously in the subdivided memory blocks, which can be operated independently of one another and in parallel for writing in and reading out data. This methodology ensures that, in the event of a memory access via the first communications interface to one of the memory blocks, a freely available memory area is available, in each case independently of this, in the other of the memory blocks, to which received data can be written at the same time via the second communications interface.

Since only point-to-point connections occur in the memory configuration according to the invention, the latter can be operated at very high frequencies. In this case, transmission frequencies of as much as 1 GHz appear to be achievable. In this case, it is possible to use memories whose memory cell arrays are subdivided into a different number of memory areas, for example memory banks, which can each be activated separately from one another.

In the memory configuration according to the invention, it is possible, moreover, to use memories which have a different number of memory cells and/or are fabricated using different fabrication technology. In other words, it is possible to combine different memories or memory modules with one another.

In this case, it is advantageous to use for the first memory a particularly fast variant for rapid communication with a micro-controller, which variant can, however, at lower data transfer rates, communicate with memories with a lower frequency and longer memory access time. During the operation of such a memory, the first and second communications interfaces accordingly have different operational speeds during the data transfer. This improves, in particular, the so-called latency for immediately successful memory accesses to the first memory. The overall costs of the memory configuration rise only comparatively moderately, however, since the second memory and, if appropriate, further memories may comply with less stringent requirements. If memories of different size are used in the same memory configuration, the memory chosen as the first memory is, for example, a particularly fast memory which, however, has a comparatively small number of memory cells.

In a further embodiment of the memory configuration, the memories are applied on a common memory module for use in a data processing system. The memory configuration can also be realized by soldering the individual memories directly onto, for example, a so-called motherboard of a PC system.

Other features which are considered as characteristic for the invention are set forth in the appended claims.

Although the invention is illustrated and described herein as embodied in a Integrated memory and memory configuration having a plurality of memories and method for operating such a memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a to 1d are diagrammatic illustrations showing different memory accesses to a memory configuration according to the invention;

FIG. 3 is a partly schematic block diagram of a further embodiment of the memory according to the invention.

DESCRIPTION OF THE PREFERRED EMBODIMENTS

Figure 2:
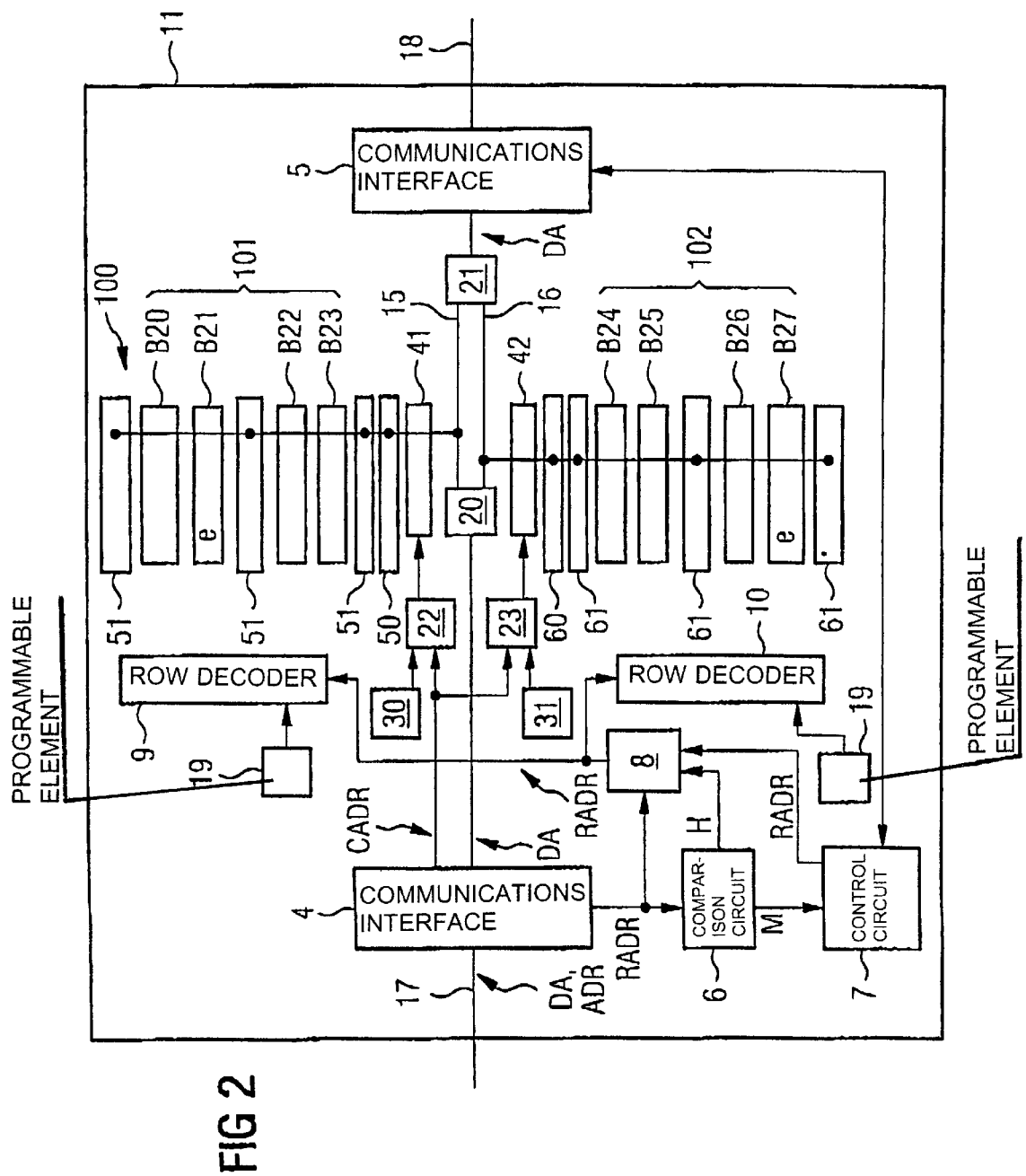
FIG. 2 is a block diagram of an embodiment of a memory according to the invention.

Referring now to the figures of the drawing in detail and first, particularly, to the FIGS. 1a, 1b, 1c, 1d thereof, there is shown a memory configuration 3 with a memory module 1, which has individual memories or memory chips 11 to 14. The memories 11 to 14 have a first communications interface 4 and a second communications interface 5. The first communications interface 4 of the memory 11 is connected to a communication bus 17; the second communications interface 5 of the memory 11 is connected to the first communications interface 4 of the memory 12. The memories 11 to 14 are each subdivided into individual independent memory areas or memory banks B1 to B16, which can each be activated separately from one another for a memory cell access. The communication bus 17 is connected to a micro-controller 2. In each of the memories 11 to 14, at least one memory bank is defined as a freely available memory bank. In other words, the memory bank does not contain information which is relevant to the system considered and could be accessed. The freely available memory banks are identified by the letters e.

The sub-figures 1a to 1d diagrammatically illustrate a total of four successive memory accesses in order to elucidate the basic functioning of the memory configuration according to the invention. In this case, a memory access performed by the micro-controller 2 to data of one of the memory banks is symbolized by a respective eliptical symbol on the communication bus 17.

FIG. 1a shows, by way of example, an access to data which are stored in the memory bank B3. Since the data sought are situated in the memory 11, the data are forwarded to the micro-controller 2.

FIG. 1b illustrates the access to data from the memory bank B9. It is ascertained in the memory 11 that the data sought are not present there. Therefore, the memory 11 sends a corresponding request to memory 12. Since the information sought is likewise not found there, the memory 12 sends a corresponding request to the memory 13, and so on. The information sought is found in the memory 13. The data sought from the entire memory bank B9 are transferred to a freely available memory bank B8 in the memory 12. The memory 12 in turn transfers these data on to a freely available memory bank in memory 11. With the data from the memory bank B9, the originally requested information is now present on the memory 11 and can be forwarded to the micro-controller 2. The data transfer from the memory 13 to the memory 11 is symbolized by the data transfer directions T1 and T2. Future memory accesses in proximity to the last memory access can now be processed more rapidly since the data of the memory bank B9 have been moved more closely to, i.e., into the vicinity of, the micro-controller.

The data transfer from the memory bank B9 can likewise be effected in another way. In this case, realizations are conceivable wherein data are transferred directly from the memory bank B9 via the memory 12 to the memory 11 without the data of the memory bank B9 first being stored in the memory 12. A further modification might consist in the data requested by the micro-controller 2 firstly being forwarded from the memory bank B9 via the memories 12 and 11 directly to the micro-controller 2, in order that the latter can immediately continue to work. Afterward, in parallel with other micro-controller accesses, the content from memory bank B9 can be transferred as far as the memory 11.

To summarize, then, in the operating method described, an address of requested data is applied to the first communications interface 4 of the memory 11 from outside the memory configuration 3. It is ascertained in the memory 11 whether the applied address corresponds to an address of data stored in the memory. In the event of correspondence of the addresses, the stored data are output via the communications interface 4. In the event of non-correspondence of the addresses, the address of the requested data is transferred to the second communications interface, the requested data are received via the communications interface 5 of the memory 11 and output via the communications interface 4.

FIG. 1c illustrates a situation that is entirely new. The data of the memory bank B9 have been moved from the memory 11, for which reason the latter no longer has a freely available memory bank. At this moment, the micro-controller effects a memory access to data of the memory bank B2. Further data transfers to the memory 11 are no longer possible since a free memory bank is no longer available. For this reason, in parallel with current memory accesses by the micro-controller, information of a memory bank is swapped from the memory 11 to the memory 12. In this case, it is advantageous to choose a memory bank whose data have not been subjected to a memory access for a relatively long time already. In this case, the data of the memory bank B1 are transferred to a previously freely available memory bank of the memory 12 (data transfer direction T3).

FIG. 1d then illustrates the new situation that has arisen. The memory bank B1 can once more be used as a freely available memory bank. The micro-controller effects a memory access to data of the memory bank B9. Since there is no longer a freely available memory bank in the memory 12, the latter, in parallel with the memory access, starts to move data from one of its occupied memory banks toward the right to the memory 13. Ideally, that memory bank which has not been accessed the longest is selected for this purpose. In this case, said memory bank is memory bank B5 (data transfer direction T4). This process is continued until all the memories of the memory module 1 have at least one freely available memory bank. In this embodiment, a method was chosen wherein in each case all the data of a relevant memory bank are transferred. Equally, in each case all the data of a memory bank of the memory 12 are received by the memory 11.

In contrast to the illustration in FIG. 1, the memories 11 to 14 or the memory cell arrays thereof can be subdivided into a different number of memory banks. Equally, it is possible for the memories 11 to 14 each to have a different number of memory cells and/or to be fabricated using different fabrication technology. By way of example, if the memory 11 and the memory 12 have a different data transmission frequency, then the communications interface 4 and the communications interface 5 of the memory 11 are operated with different operational speeds during the data transfer.

FIG. 2 shows an exemplary embodiment of an integrated memory according to the invention. The novel method according to the invention for operating a memory configuration can be carried out with that memory. The memory 11 has a memory cell array 100 for storing data, which is subdivided into memory blocks 101 and 102 which can each be operated independently of one another for writing in and reading out data. Each of the memory blocks 101 and 102 is subdivided into memory areas or memory banks B20 to B23 and B24 to B27, respectively. At the same time, a freely available memory bank, identified by the letter e, is in each case defined in each of the memory blocks 101 and 102. Sense amplifier strips 51 and 61, respectively, and a respective second sense amplifier 50 and 60, respectively, are provided for reading out data stored in the memory cell array 100. For a memory cell access, the memory blocks are each activated by row decoders 9 and 10, respectively. In order to read out a data signal DA from the memory cell array 100, corresponding column decoders 41 and 42 are activated.

The memory 11 additionally has a communications interface 4 and a communications interface 5. These can each be operated independently of one another and are each connected to the data bus systems 15 and 16. The communications interface 4 is connected to the communication bus 17, via which data signals DA and address signals ADR are transmitted. The communications interface 5 is connected to a communication bus 18.

The memory 11 furthermore has a comparison circuit 6, which is connected to the communications interface 4 and serves for comparing an address of data stored in the memory cell array 100 with an address RADR applied to the communications interface 4. In this case, the row address RADR is part of the address ADR. The comparison circuit 6 is connected to a control circuit 7, which, for its part, is connected to the communications interface 5 and serves, in particular, for forwarding the address of the requested data to the communications interface 5.

The provision of two data bus systems 15 and 16 makes it possible for both communications interfaces 4 and 5 to be actively operated simultaneously. As a result, by way of example, a memory access can be carried out via the communications interface 4 to the memory bank B25 and, at the same time, a memory access can be carried out via communications interface 5 to memory bank B21, for example. This can be carried out advantageously in particular if the loading of data of a memory bank via communications interface 5 lasts a relatively long time. No sought data can otherwise be output via the left-hand communications interface 4 during this time.

In order that, during the loading of data via communications interface 5, the information sought is simultaneously forwarded via communications interface 4, provision is made of the multiplex circuits 20 and 21, which are each connected between one of the communications interfaces 4 and 5 and the data bus systems 15 and 16.

For the purpose of simple realization of the memory, a data protocol is provided, wherein in each case only all the data of a complete memory bank are transferred or received via the communications interface 5. As a result, all that is required is to transmit a start address once and then to receive or to transfer the data incrementally. The required data addresses are generated incrementally for example by the sending memory or receiving memory. The corresponding address information for a data transfer via the communications interface 5 is provided by a counter circuit 30 and 31, respectively. The latter are each connected to a multiplex circuit 22 and 23, respectively, which, at a second input, are each connected to an address bus for transferring the column address CADR. The outputs of the multiplex circuits 22 and 23 are connected to the respective column decoders 41 and 42.

The comparison circuit 6 records which of the memory banks B20 to B27 currently comprises which address ranges of the application information. By way of example, if a specific memory address is accessed via communications interface 4, then the comparison circuit 6 effects a comparison as to whether the memory address is available in one of the memory banks B20 to B27. Only afterward can the corresponding physical row address be identified and activated. If this is not the case, then a signal M is generated which activates the control circuit 7. The control circuit 7 subsequently requests the data of the corresponding memory bank with the desired information via communications interface 5 and causes the data of this memory bank to be loaded into one of the freely available memory banks of the memory cell array 100.

The row control circuit 8 has the task of resolving possible conflicts for the row address RADR. Said conflicts may arise for example in the event of simultaneous access through communications interface 4 and 5. By way of example, if communications interface 4 accesses data in memory bank B25, then the signal H is activated since the data sought are present in the memory 11. Accordingly, the physical row address of the bank B25 must be activated, i.e. no new row information can simultaneously be transferred via communications interface 5.

The memory 11 additionally has programmable elements 19 which can inhibit one of the memory banks of the memory for a data access. To that end, the address of a memory bank to be deactivated is stored in the programmable elements 19. The programmable elements 19 can be programmed for example by means of an electric voltage or by means of a laser beam fed in externally.

FIG. 3 illustrates a further embodiment of a memory according to the invention. The memory 11 is connected to the memory 12 via communications interface 5. In order to operate this memory configuration, the latter has a clock signal CK connected to a clock input CE of the memory 11. A clock output CA of the memory 11 is connected to a clock input CE of the memory 12. Simple driver circuits 90 may advantageously be provided for transmission of the clock signal CK. An internal clock signal CKI for controlling the operation of the memory 11 is generated from the clock signal CK.

Conventional memory systems are usually provided with a global clock which has to be distributed to all the system components over relatively long distances. However, since the memory configuration described is based only on local point-to-point communications, a fixed time reference is only necessary in each case between two connected memories. Therefore, it is sufficient to provide a time reference in the form of a clock signal in each case over shorter distances only between two communicating memories. In addition to the simple realization, this ensures that an exact time reference is provided for communication between two memories.

The memory 11 in accordance with FIG. 3 has a plurality of registers 70, 71 and 80, 81 in each case for storing a different part of an address of data stored in the memory 11. In these registers, the row address of the present memory access is compared with memory addresses of data which are currently stored in the memory banks of the memory. As a result, it is ascertained whether the desired information is available and what memory bank it is stored in. Only afterward can the corresponding physical row address be identified and activated.

The larger the memory space required for comparison of the addresses, the slower the comparison and thus the memory access. For this reason, it is advantageous that the registers are each connected to the communications interface 4 independently of one another, in order to carry out a comparison of the respective partial addresses with the address applied to the communications interface 4. This results in a hierarchical row cache system constructed in a distributed manner. Said system is subdivided into the register groups 70, 71 and 80, 81. The registers 70, 71 decide, for example using a part of the row addresses, whether the data sought are situated in the upper half of the memory cell array or in the lower half of the memory cell array. In parallel with this, the remaining row addresses are fed in parallel to the registers 80 and 81. The latter decide which of the respective four memory banks are activated. In this case, the parallel processing increases the speed. Other divisions or serial methods for comparing the row addresses are also conceivable here.

I claim:

1. An integrated memory, comprising:

a memory cell array for storing data;

first and second communications interfaces for data transfer each connected to a data bus system, and each said first and second communications interfaces being operable independently of one another;

wherein said memory cell array can be connected to the data bus system for a memory cell access;

a comparison circuit connectible to said first communications interface, said comparison circuit comparing an address of data stored in said memory cell array with an address applied to said first communications interface, and activating said memory cell array for a memory cell access in dependence on a comparison result; and a control circuit connectible to said comparison circuit and said second communications interface, for forwarding the applied address to said second communications interface in dependence on the comparison result of said comparison circuit.

2. The integrated memory according to claim 1, wherein said memory cell array is subdivided into a plurality of memory areas, and each of said memory areas can be activated separately from one another.

3. The integrated memory according to claim 2, which further comprises a programmable element, and wherein one of said memory areas is a deactivatable memory area, and an address of said deactivatable memory area is stored in said programmable element.

4. The integrated memory according to claim 1, which further comprises a counter circuit for providing address information for a data transfer via said second communications interface.

5. The integrated memory according to claim 1, wherein said memory cell array is divided into two memory blocks independently connectible to said data bus system.

6. The integrated memory according to claim 1, which comprises two data bus systems respectively connected to said first and second communications interfaces and operable separately from one another.

7. The integrated memory according to claim 6, which further comprises a multiplex circuit connected between one of said communications interfaces and said data bus systems.

8. The integrated memory according to claim 1, which further comprises a plurality of registers each storing a different part of an address of stored data.

9. The integrated memory according to claim 8, wherein said registers are each connectible to said first communications interface independently of one another, for comparing a respective partial address with the address applied to said first communications interface.

10. A memory configuration, comprising a plurality of memories each formed as an integrated memory according to claim 1 and including a first memory and a second memory, wherein said first communications interface of said first memory is connected to a communication bus and said second communications interface of said first memory is connected to said first communications interface of said second memory.

11. The memory configuration according to claim 10, wherein said memory cell arrays of said plurality of memories are subdivided into a different number of separately activatable memory areas.

12. The memory configuration according to claim 10, wherein said memories have a different number of memory cells.

13. The memory configuration according to claim 10, wherein said memories are fabricated using different fabrication technology.

14. The memory configuration according to claim 10, wherein said memories are disposed on a common memory module configured for use in a data processing system.

15. The memory configuration according to claim 10, wherein said first and second communications interfaces of said first memory have different operational speeds during a data transfer.

16. The memory configuration according to claim 10, which comprises a terminal for a clock signal of the memory configuration connected to a clock input of said first memory, and wherein a clock output of said first memory is connected to a clock input of said second memory.

17. A method of operating a memory configuration having at least a first memory for storing data, first and second communications interfaces for data transfer to and from said first memory, and having a second memory for storing data, first and second communications interfaces for data transfer to and from said second memory, wherein the first communications interface of the second memory is connected to the second communications interface of the first memory, the method which comprises:

operating the first and second communications interfaces of the first and second memories independently of one another;

applying an address of requested data from outside the memory configuration to the first communications interface of the first memory;

ascertaining whether the applied address corresponds to an address of data stored in the first memory;

if the applied address corresponds to an address of data stored in the first memory, outputting stored data via the first communications interface of the first memory;

if the applied address does not correspond to an address of data stored in the first memory, transferring the address of the requested data to the second communications interface of the first memory, receiving the requested data from the first communications interface of the second memory via the second communications interface of the first memory, and outputting the requested data via the first communications interface of the first memory.

18. The method according to claim 17, which comprises storing the data received via the second communications interface of the first memory in the first memory.

19. The method according to claim 18, which comprises storing the received data in the first memory after having been output via the first communications interface thereof.

20. The method according to claim 17, which comprises defining a freely available memory area for storing data in the first memory, and storing the received data in the freely available memory area.

21. The method according to claim 20, which comprises keeping the freely available memory area free of requestable data prior to storing the received data.

22. The method according to claim 21, wherein the first memory is subdivided into memory areas for storing data, and the method comprises transferring data of one of the memory areas to the second memory and defining one of the memory areas as freely available memory area.

23. The method according to claim 22, which comprises transferring the data of one of the memory areas if no freely available memory area is available in the first memory.

24. The method according to claim 22, which comprises transferring all data of one of the memory areas.

25. The method according to claim 20, wherein the first memory is subdivided into memory blocks for storing data, and the memory blocks are operated independently of one another for writing in and reading out data, and a respective freely available memory area is simultaneously defined in the memory blocks.

26. The method according to claim 17, wherein the second memory is subdivided into memory areas for storing data, and the method comprises receiving in each case all data of one of the memory areas of the second memory via the second communications interface of the first memory.

27. The method according to claim 17, wherein at least one of the first and second memories is subdivided into memory areas for storing data, and the method comprises inhibiting one of the memory areas from a data access.

28. The method according to claim 17, which comprises operating the first communications interface and second communications interface of one of the memories in parallel for the data transfer.

* * * * *